United States Patent [19]

Wang et al.

[11] Patent Number: 4,616,404
[45] Date of Patent: Oct. 14, 1986

[54] METHOD OF MAKING IMPROVED LATERAL POLYSILICON DIODE BY TREATING PLASMA ETCHED SIDEWALLS TO REMOVE DEFECTS

[75] Inventors: Scott W. Wang, Sunnyvale; Mammen Thomas; Wen C. Ko, both of San Jose, all of Calif.

[73] Assignee: Advanced Micro Devices, Inc., Sunnyvale, Calif.

[21] Appl. No.: 676,684

[22] Filed: Nov. 30, 1984

[51] Int. Cl.[4] .................. H01L 21/265; H01L 21/425
[52] U.S. Cl. ..................................... 29/576 B; 29/571; 29/577 C; 148/1.5; 148/187; 148/DIG. 10; 357/59; 357/91
[58] Field of Search ................. 29/576 B, 577 C, 571; 148/1.5, 187; 357/59, 91

[56] References Cited

U.S. PATENT DOCUMENTS

| | | |
|---|---|---|
| 4,377,819 | 3/1983 | Sakai et al. ............................ 357/59 |
| 4,438,556 | 3/1984 | Komatsu et al. ................... 29/576 B |
| 4,450,470 | 5/1984 | Shiba .................................... 357/59 |
| 4,494,135 | 1/1985 | Moussie ............................... 357/59 |
| 4,520,552 | 6/1985 | Arnould et al. ..................... 29/571 |
| 4,538,169 | 8/1985 | Yoshino et al. ..................... 357/59 |
| 4,543,595 | 9/1985 | Vora ..................................... 357/59 |
| 4,560,419 | 12/1985 | Bourassa et al. ..................... 148/1.5 |

OTHER PUBLICATIONS

Saito et al., J. Appl. Phys. 57 (1985) 1190.
Dutoit et al., J. Electrochem. Soc. 125 (1978) 1648.
Mahan et al., IEEE Trans. Electron Devices, ED 30 (1983) 45.
Dockerty, R. C., IBM-TDB, 25 (1983) 6150.

Primary Examiner—Upendra Roy
Attorney, Agent, or Firm—Patrick T. King; J. Vincent Tortolano; John P. Taylor

[57] ABSTRACT

An improved lateral polysilicon diode in an integrated circuit structure is disclosed. The diode is characterized by low reverse current leakage, a breakdown voltage of at least 5 volts, and low series resistance permitting high current flow before being limited by saturation. The polysilicon diode comprises a polysilicon substrate having a first zone sufficiently doped to provide a first semiconductor type and a second zone sufficiently doped to provide a second semiconductor type whereby the junction between the two zones forms a diode. The lateral edges of the diode are treated to remove defects to thereby inhibit current leakage around the edges of the lateral diode to lower the reverse current leakage of the diode.

19 Claims, 8 Drawing Figures 4,616,404

METHOD OF MAKING IMPROVED LATERAL POLYSILICON DIODE BY TREATING PLASMA ETCHED SIDEWALLS TO REMOVE DEFECTS

BACKGROUND OF THE INVENTION

1. Technical Field of the Invention

This invention relates to an improved lateral polysilicon diode and a method for forming same in an integrated circuit device.

2. Background Art

In general, the fabrication of a lateral diode in a film or layer of polysilicon, i.e., polycrystalline silicon, is well known to those skilled in the art. However, such diodes usually have high reverse current leakage if the polysilicon is doped sufficiently to lower the series resistance to provide satisfactory current flow before the diode saturates. The effects of dopant concentration on both forward current-voltage characteristics as well as reverse current leakage was discussed by Manoliu et al in "P-N Junctions in Polycrystalline-Silicon Films", Solid State Electronics, Volume 15, 1972, at pages 1103–1106.

Dutoit et al in "Lateral Polysilicon p-n Diodes" published in the Journal of Electrochem. Society: Solid-State Science and Technology, Volume 125, Number 10, October, 1978, at pages 1648–1651, stated that high value resistors or leaky diodes required in integrated circuits could easily be implemented using lateral polysilicon diodes. Dutoit et al noted that an excess reverse current, not accounted for by classical theories, was observed in heavily doped diodes.

While it is known that lowering the amount of doping will, in turn, lower the reverse current leakage of such polysilicon diodes, this has the undesirable effect of raising the series resistance of the diode which will cause it to saturate at too low a voltage resulting in low current flow.

Mandurah et al in "A Model for Conduction in Polycrystalline Silicon - Part I: Theory", in the IEEE Transactions on Electron Devices, Volume ED-28, Number 10, October, 1981, at pages 1163–1171, discussed some of the theories or models used to explain the resistivity variations with doping concentrations in polycrystalline silicon. Both the carrier-trapping model and the dopant-segregation model were discussed by the authors who proposed that the conduction may be a combining of the mechanisms of dopant-segregation, carrier-trapping and carrier-reflection at the grain boundaries of the polycrystalline silicon. Grain boundaries were assumed to behave as an intrinsic wide-band-semiconductor forming a heterojunction with the grains.

However, despite the amount of research and postulation as to the conduction phenomena occurring in P-N junctions formed from polycrystalline silicon, the fact still remains that if polysilicon is sufficiently doped to lower the series resistance to provide acceptable forward voltage drops, such high doping not only reduces the series resistance but also increases the reverse current leakage as well as reducing the breakdown voltage of the device.

It would, therefore, be desirable to fabricate a diode from polysilicon having reduced reverse current leakage while still maintaining a low enough series resistance to permit high forward current flow without saturating.

SUMMARY OF THE INVENTION

It is therefore an object of the invention to provide a lateral diode constructed of polycrystalline silicon characterized by a low reverse current leakage as well as low series resistance.

It is another object of this invention to provide a diode constructed of polycrystalline silicon characterized by low reverse current leakage as well as low series resistance wherein reverse current leakage is reduced by repairing the damaged sidewalls of the polysilicon diode as it is formed.

It is yet another object of this invention to provide a diode constructed of polycrystalline silicon characterized by a low reverse current leakage as well as low series resistance whereby current leakage is reduced by etching the damaged sidewalls of the polysilicon diode as it is formed to repair damage thereto and a protective layer of oxide is placed over the repaired sidewalls.

It is a further object of the invention to provide a process of construction of a lateral polydiode which is self aligned, whereby the junction formed is defined by the structure of the diode.

These and other objects of the invention will be apparent from the description and accompanying drawings.

DESCRIPTION OF THE PREFERRED EMBODIMENT

The novel polysilicon diode of the invention may be fabricated and utilized in connection with either bipolar or MOS type devices. FIGS. 2–6, which illustrate the step by step construction of the polysilicon diode, therefore merely illustrate the underlying integrated circuit structure as a substrate 10.

Figure 1:
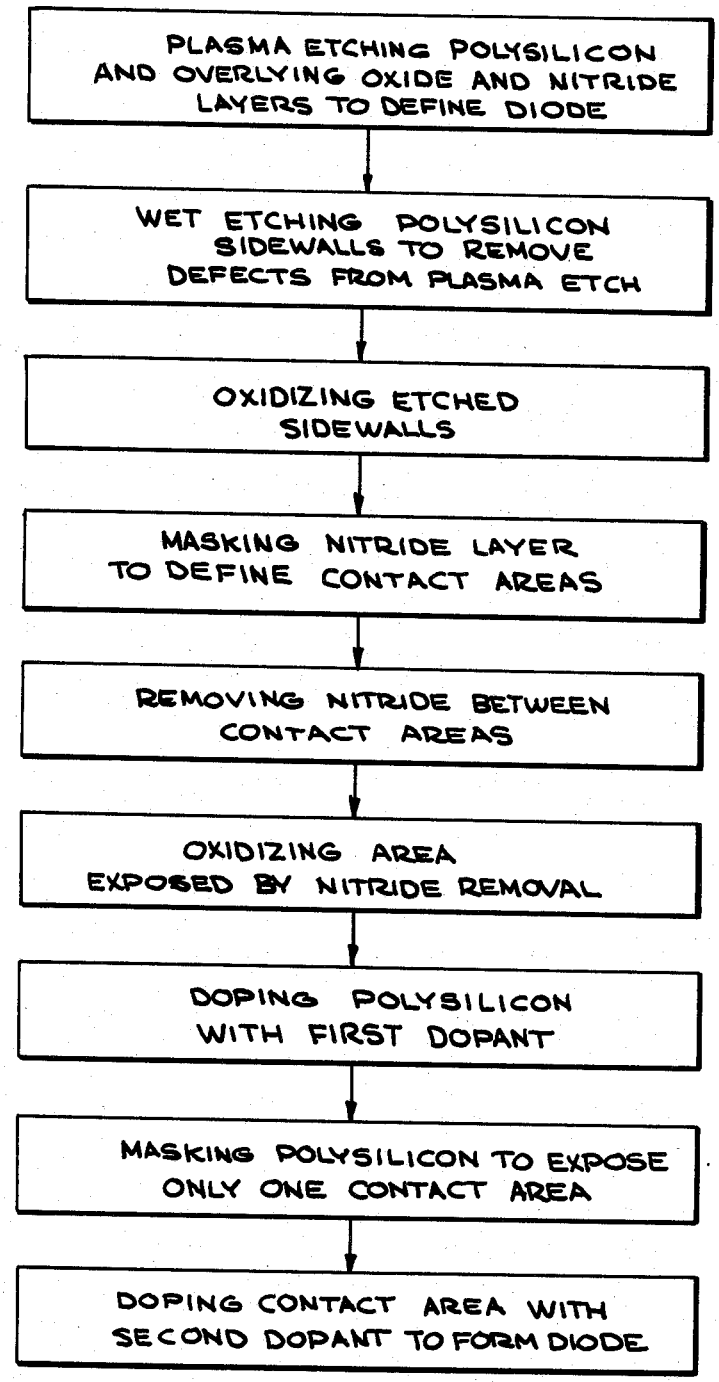
FIG. 1 is a flow sheet illustrating the process used to produce the novel polysilicon diode of the invention.
Figure 2:
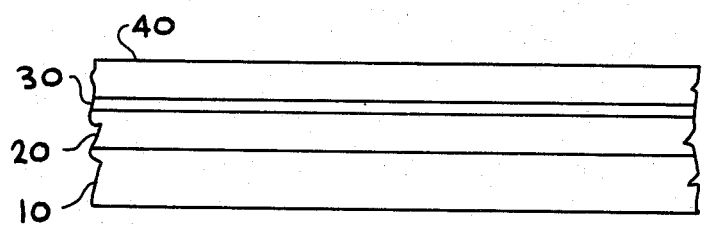
FIG. 2 is a side cross-sectional view illustrating the initial etching to form the diode.

Referring now to FIG. 2, the substrate 10, representing a typical underlying integrated circuit structure, is shown with a polysilicon layer 20 thereon having a thickness of 3000 to 6000 Angstroms deposited thereon depending upon the desired current carrying capacity of the diode. A buffer oxide layer 30 of silicon dioxide, having a typical thickness of 350 Angstroms, is thermally grown over polysilicon layer 20. A slow oxidizing layer, which may be removable independent of the oxide layer, such as a silicon nitride layer 40, is then formed over the oxide layer 30 by deposition of a nitride, from ammonia and a silicon-containing material such as silane, to provide a layer typically about 1000 Angstroms thick.

Figure 3:
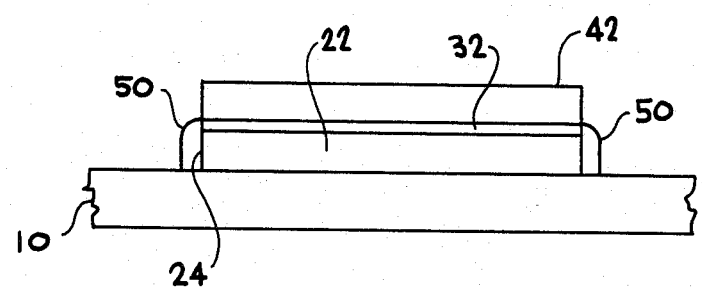
FIG. 3 is a side cross-sectional view showing the sidewalls of the diode after repair and oxidation of the sidewalls.

Turning now to FIG. 3, the resulting three layer structure is masked and etched using a suitable plasma etch, such as $SF_6$, to etch the nitride, oxide and polysilicon layers leaving behind portion 22 of the polysilicon layer, together with, respectively, portions 32 and 42 of the oxide and nitride layers thereon. Portion 22 will ultimately form the polysilicon diode.

In accordance with the invention, the sidewall 24 of polysilicon portion 22 is then wet etched with a chemical etch, such as chromium trioxide to remove any defects formed in the lateral edges or polysilicon sidewall 24 by the plasma etch. Preferably about 300–400 Angstroms of sidewall 24 is etched away to provide a smooth surface. Thermal oxide, i.e., silicon dioxide, is then grown, as shown at 50, over the newly etched side surface to a thickness sufficient to protect the sidewall surface during further processing, preferably about 800–1000 Angstroms.

Figure 5:
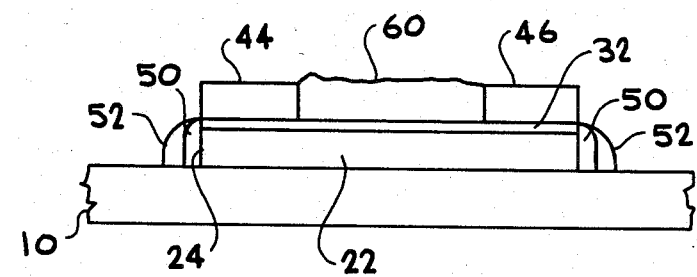
FIG. 5 is a side cross-sectional view of a further step in the construction of the diode.

In FIG. 5, the device is shown after masking to define contacts areas 44 and 46 in nitride portion 42. The silicon nitride between contact areas 44 and 46 is then etched away using a suitable etchant, such as hot phosphoric acid. Thermal oxide is then grown at this point to provide a layer 60 of silicon dioxide of about 3500 Angstroms thick. This thickness is limited by the oxide quality and may be thinner if a good quality oxide can be grown. At the same time, a further increment or layer 52 of thermal oxide is grown over silicon dioxide layer 50 on sidewall 24. This provides a total silicon dioxide thickness of more than 3500 Angstroms around sidewall 24 of the polysilicon diode.

Polysilicon portion 22 is now doped by implanting boron at a dose or concentration of from $1 \times 10^{14}$ to $1 \times 10^{15}$ atoms per $cm^{-2}$ and using an energy level sufficient to pass through the oxide and nitride layers, preferably about 180 KEV. At this energy level the boron dopant will penetrate the nitride contact areas 44 and 46 as well as silicon dioxide layers 60 and 32 to dope the polysilicon portion 22 to form a P or P+ region. It should be noted here that the amount of dopant used in this step is preselected to obtain the desired series resistance. Unlike prior art construction, the repairing of defects in polysilicon sidewall 24 lowers the reverse current leakage sufficiently to permit such doping levels, proving the fact that the surface leakage is the major contributor of reverse leakage and not junction leakage.

Figure 6:
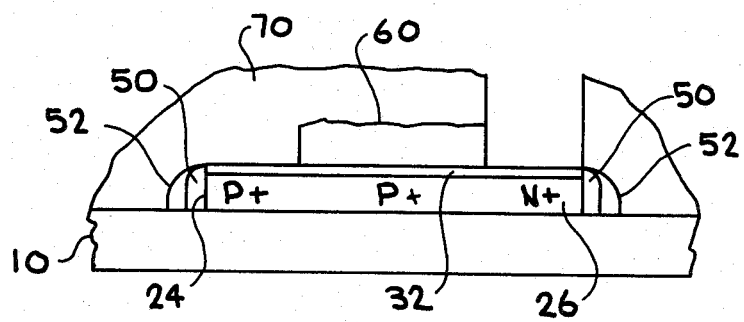
FIG. 6 is a side cross-sectional view illustrating the diode in completed form ready for attachment to suitable contacts.
Figure 4:
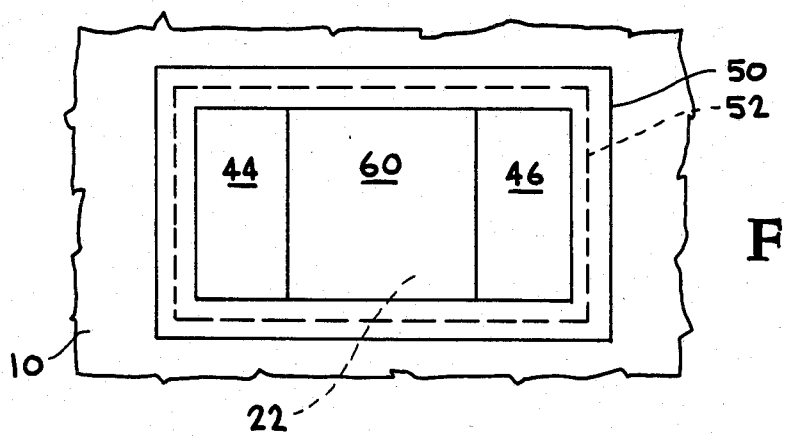
FIG. 4 is a top view of the structure shown in FIG. 3.

Following the boron implant, nitride contact portions 44 and 46 are chemically wet etched with phosphoric acid to remove the nitride. As shown in FIG. 6, a layer of photoresist 70 is then placed over the device. Photoresist layer 70 is then masked to expose contact 26, i.e., the area in polysilicon 22 previously defined by overlying nitride contact area 46. An N+ doped region is then formed in contact area 26 by implanting phosphorus or arsenic at a dose or concentration of from $1 \times 10^{15}$ to $1 \times 10^{16}$ atoms per $cm^{-2}$ at 180 KEV. The phosphorus or arsenic dopant, at this energy level and concentration, will only penetrate the polysilicon layer at portion 26, i.e., it will not pass through photoresist layer 70 or oxide layer 60. After removing photoresist layer 70, the implant is then annealed at 1000° C. for about 30 minutes. It should be noted here that the position of the photoresist mask over region 26 is not critical because oxide portions 50, 52, and 60 beneath the photoresist mask will provide self alignment for the formation of N+ contact region 26. Metal contacts are then applied using conventional masking techniques well known to those skilled in the art.

Figure 7:
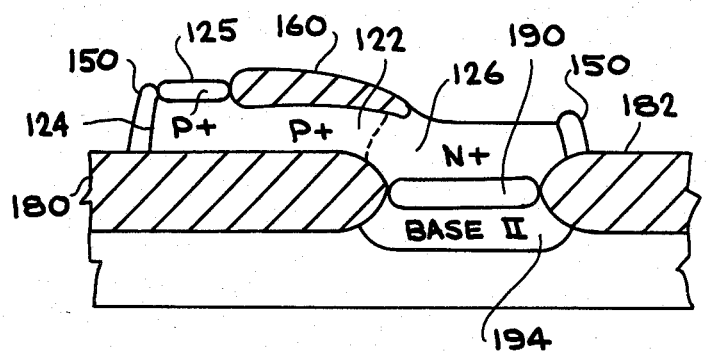
FIG. 7 is a side view showing a portion of an integrated circuit structure comprising a portion of a bipolar device with a lateral polysilicon diode constructed thereon in accordance with the invention.

Turning now to FIG. 7, a lateral polysilicon diode, constructed in accordance with the invention, is shown in connection with the base and emitter of a bipolar transistor. The polysilicon layer 122 has been doped to provide a P+ region with a P+ contact 125. A layer of silicon dioxide 160 separates P+ contact 125 from N+ contact 126. In accordance with the invention, sidewall oxide 150 has been grown around sidewall 124 of polysilicon layer 122 after etching of the sidewall to remove defects caused by the initial plasma etching to define the polysilicon used to construct the diode. As shown in the drawings, field oxide portions 180 and 182 wall off emitter 190 and base 194 of the bipolar transistor from adjacent devices.

Figure 8:
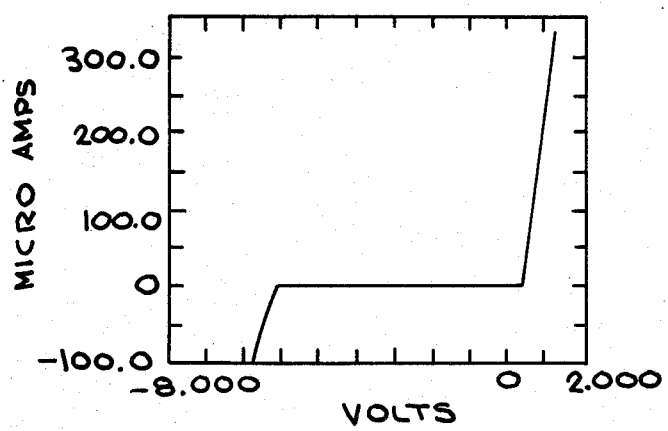
FIG. 8 is a graph showing the forward current and reverse current leakage of a typical lateral polysilicon diode made in accordance with the invention.

In FIG. 8, both the leakage current and the forward current of a lateral polysilicon diode constructed in accordance with the invention are plotted to show the low reverse current leakage as well as the high forward current which is indicative of the high doping levels used. It will be seen that, surprisingly, despite the high doping levels used to obtain the resulting high current as the voltage approaches 2 volts, the reverse leakage current of the diode remains at low nanoamperes until the reverse voltage bias approaches −5 volts. When tested, the device was further found to have a reverse breakdown voltage level of over 5 volts.

Thus, the invention provides a novel lateral polysilicon diode which may be constructed on an integrated circuit structure wherein the diode is characterized by high forward current with low series resistance while exhibiting low reverse current leakage by repairing the damage to the sidewalls of the polysilicon diode as it is constructed and providing a protective thermal oxide layer around the repaired polysilicon sidewall. While we do not wish to be bound by any particular theory of operation, it appears that repairing the damaged sidewall reduces the number of defects, which, in turn, reduces in some manner the amount of reverse current which would otherwise leak around the sides or edges of the diode. Minor modifications may be made in the construction of the novel diode of the invention without departing from the spirit of the invention as defined by the appended claims.

Having thus described the invention, what is claimed is:

1. An improvement in the process for forming a lateral polysilicon diode in a polysilicon layer on an integrated circuit structure wherein said polysilicon layer is initially plasma etched to form the polysilicon body for said diode and then selectively doped sufficiently in two areas to form a low resistance semiconductor diode; said improvement comprising:

treating the lateral edges of said polysilicon remaining after said plasma etch to remove defects therein whereby current leakage around the lateral edges of the resulting diode are reduced resulting in a polysilicon diode characterized by low reverse current leakage, a breakdown voltage of at least 5 volts, and low series resistance permitting high current flow before being limited by saturation.

2. The improved process of claim 1 wherein said treating of said lateral edges comprising wet etching the lateral edges of said polysilicon.

3. The improved process of claim 2 wherein said etched lateral edges of said polysilicon are protected by silicon oxide thermally grown over said wet etched lateral edges.

4. An improved process for forming, in an integrated circuit structure, a polysilicon diode characterized by low reverse current leakage, a high breakdown voltage, and low series resistance thereby permitting high current flow; said process comprising:
(a) depositing at least a layer of polysilicon on an integrated circuit substrate;
(b) masking and selectively plasma etching away a portion of said layer of polysilicon;
(c) treating the sidewall of the remaining polysilicon layer to remove defects in said polysilicon sidewall;
(d) thermally growing silicon dioxide over said treated sidewall to protect said treated sidewall;
(e) doping said polysilicon layer with a first dopant; and
(f) selectively doping a portion of said doped polysilicon layer with a second dopant to form said diode; whereby said treatment of said sidewall to remove defects and subsequent growing of thermal oxide thereon reduces reverse current leakage through the sidewall thereby permitting higher doping concentrations to reduce the series resistance without adversely affecting the reverse current leakage.

5. The process of claim 4 wherein said polysilicon diode sidewall treatment step comprises wet etching said polysilicon sidewall to remove defects.

6. The process of claim 5 wherein said sidewall is wet etched sufficiently to remove from 300 to 500 Angstroms of polysilicon sidewall.

7. The process of claim 6 wherein said wet etching step is carried out for a time period sufficient to remove about 400 Angstroms of polysilicon sidewall.

8. The process of claim 7 wherein said thermal oxide growing step includes growing said silicon dioxide over said etched polysilicon sidewall to a thickness of from 3000 to 4000 Angstroms to protect said sidewall.

9. The process of claim 7 including, prior to said plasma etching step, the further steps of growing a first buffer oxide layer over said polysilicon layer; and placing a silicon nitride layer over said buffer oxide layer; and wherein said plasma etching step etches through said polysilicon, silicon dioxide, and silicon nitride layers to leave a multilayer portion generally defining said diode shape.

10. The process of claim 9 including the steps of growing a first thermal oxide layer over said wet etched sidewall; masking said nitride layer to define two spaced apart contact areas; removing that portion of said nitride layer between said nitride-coated contact areas; and thermally growing silicon dioxide over the exposed silicon dioxide layer under said etched away portion of said silicon nitride layer and over said previously grown silicon dioxide on said sidewalls.

11. The process of claim 10 wherein said last step of thermal oxide growth is carried out for a time period sufficient to place a silicon dioxide layer of from 3000 to 4000 Angstroms over said silicon dioxide exposed by said silicon nitride removal and over said initially grown silicon dioxide on said sidewall.

12. The process of claim 11 including doping said polysilicon with a dopant having a sufficient concentration to penetrate through said silicon dioxide and silicon nitride layers overlying said polysilicon.

13. The process of claim 12 including doping said polysilicon with a dopant having a sufficient concentration to provide a resistance in the polysilicon of from 100 to 1000 ohms per square.

14. The process of claim 11 wherein said doping step includes doping said polysilicon with a dopant implanted at sufficient energy and in sufficient concentration to penetrate through overlying silicon dioxide and silicon nitride portions.

15. The process of claim 14 wherein said doping step comprises implanting said boron at a dose of from about $1 \times 10^{14}$ to $1 \times 10^{15}$ atoms cm$^{-2}$ and an energy of about 180 KEV.

16. The process of claim 15 including the steps of removing said remaining silicon nitride after said boron doping; coating said remaining portions with photoresist; patterning said photoresist to expose one of said contact areas; and doping said exposed contact area with a dopant selected from the class consisting of arsenic and phosphorus to form a second doped region in said polysilicon thereby forming a semiconductor diode junction therein.

17. The process of claim 16 including the steps of removing said remaining silicon nitride after said boron doping step and using an oversize mask to define and open the areas for said contact doping step thereby using the oxide edge to self define the diode.

18. The process of claim 16 wherein said doping step comprises implanting said dopant at a dose of from about $1 \times 10^{15}$ to $1 \times 10^{16}$ atoms cm$^{-2}$ at an energy of about 180KEV.

19. An improved process for forming, in an integrated circuit structure, a lateral polysilicon diode characterized by low reverse current leakage, a breakdown voltage of at least 5 volts, and low series resistance thereby permitting high current flow during normal operating conditions; said process comprising:
(a) depositing a layer of polysilicon of from 3000 to 6000 Angstroms thickness over said integrated circuit structure;
(b) thermally growing a silicon dioxide buffer layer of at least 300 Angstroms over said polysilicon layer;
(c) depositing a silicon nitride layer of at least 800 Angstroms thickness over said silicon dioxide layer;
(d) masking and plasma etching said layers to define said diode;
(e) treating the exposed edges of said polysilicon layer defining said diode by chemically etching to remove at least about 300 Angstroms of polysilicon to thereby remove defects in said edges caused by said plasma etching;
(f) thermally growing silicon dioxide over said wet etched polysilicon edges;
(g) masking said layers to define 2 contact areas;
(h) etching said silicon nitride to remove the silicon nitride between said 2 contact areas;
(i) thermally growing further silicon dioxide in said area exposed by removal of said silicon nitride and over said silicon dioxide on said edges to provide a thickness in both regions of at least 3500 Angstroms;
(j) implanting a boron dopant into said polysilicon at an energy of about 180 KEV and a dose of from about $1 \times 10^{14}$ to $1 \times 10^{15}$ atoms cm$^{-2}$ to form a p-doped region in said polysilicon;
(k) removing the remainder of said nitride layer over said contact areas;

(l) placing a photoresist layer over said layers and masking said photoresist to expose one of said contact areas;

(m) implanting a phosphorus dopant into said exposed contact area at a dose of from about $1 \times 10^{15}$ atoms $cm^{-2}$ to $1 \times 10^{16}$ atoms $cm^{-2}$ at an energy level of about 180 KEV to form an n-doped area within a portion of said p-doped polysilicon and annealing said doped polysilicon to thereby form a semiconductor diode;

said treatment of said plasma etched edges to remove defects acting to reduce surface leakage around the edges of said diode thereby reducing the reverse current leakage of said device.

* * * * *